United States Patent
Kent et al.

(10) Patent No.: US 9,307,325 B2
(45) Date of Patent: Apr. 5, 2016

(54) TRANSDUCER ARRANGEMENT

(71) Applicant: BAE SYSTEMS plc, London (GB)

(72) Inventors: Lionel William John Kent, Chelmsford (GB); John Martin Bagshaw, Chelmsford (GB); Duncan Peter Rowe, Chelmsford (GB)

(73) Assignee: BAE SYSTEMS plc, London (GB)

( * ) Notice: Subject to any disclaimer, the term of this patent is extended or adjusted under 35 U.S.C. 154(b) by 0 days.

(21) Appl. No.: 14/371,089

(22) PCT Filed: Jan. 7, 2013

(86) PCT No.: PCT/GB2013/050014
§ 371 (c)(1),
(2) Date: Jul. 8, 2014

(87) PCT Pub. No.: WO2013/104893
PCT Pub. Date: Jul. 18, 2013

(65) Prior Publication Data
US 2014/0355388 A1  Dec. 4, 2014

(30) Foreign Application Priority Data

Jan. 9, 2012 (GB) .................................. 1200232.5

(51) Int. Cl.
*H04R 17/00* (2006.01)
*H04B 11/00* (2006.01)
(Continued)

(52) U.S. Cl.
CPC *H04R 17/00* (2013.01); *B06B 3/00* (2013.01); *H01L 41/107* (2013.01); *H04B 11/00* (2013.01); *H04B 13/00* (2013.01); *H04R 31/00* (2013.01); *Y10T 29/49005* (2015.01)

(58) Field of Classification Search
CPC ........ G10K 9/125; H04R 17/00; H04R 31/00; H04B 11/00; H04B 14/00; B06B 3/00
See application file for complete search history.

(56) References Cited

U.S. PATENT DOCUMENTS

| 4,242,653 A | 12/1980 | Moore |
| 4,677,336 A | 6/1987 | Kushida et al. |

(Continued)

FOREIGN PATENT DOCUMENTS

| WO | 9209050 | 5/1992 |
| WO | 2008075092 A1 | 6/2008 |
| WO | 2013104893 A1 | 7/2013 |

OTHER PUBLICATIONS

International Search Report and Written Opinion received for Patent Application No. PCT/GB2013/050014, mailed on Apr. 24, 2013, 14 pages.
GB Intellectual Property Office Search Report under Section 17(5) received for GB Patent Application No. 1200232.5 mailed May 3, 2012, 4 pages.
Brown, et al., "Fabrication and Performance of a High-Frequency Geometrically Focussed Composite Transducer With Trianuglar Pillar Geometry," 2007 IEEE Ultrasonics Symposium, pp. 80-83.
(Continued)

*Primary Examiner* — Luke Ratcliffe
*Assistant Examiner* — Hovhannes Baghdasaryan
(74) *Attorney, Agent, or Firm* — Finch & Maloney PLLC

(57) ABSTRACT

There is disclosed a transducer apparatus for acoustic communications through a substrate at a predetermined center frequency, the apparatus comprising:—an active piezoelectric element for generating an acoustic signal; an intermediate layer, having a surface for accommodating the piezoelectric element, and having a first array of protrusions on a surface opposite the surface for accommodating the piezoelectric element; and a second array of protrusions at the substrate, wherein the active piezoelectric element is mounted onto the intermediate layer, and the intermediate layer is secured in position relative to the substrate such that the first array of protrusions faces the second array of protrusions such that the acoustic signal may propagate through the first and second arrays. There are further disclosed a method of mounting such an apparatus and a plate suitable for use in the transducer apparatus.

18 Claims, 9 Drawing Sheets

(51) Int. Cl.
  *H04B 13/00* (2006.01)
  *H01L 41/107* (2006.01)
  *B06B 3/00* (2006.01)
  *H04R 31/00* (2006.01)

(56) References Cited

U.S. PATENT DOCUMENTS

| | | | | |
|---|---|---|---|---|
| 5,648,643 | A | | 7/1997 | Knowles et al. |
| 5,923,617 | A | * | 7/1999 | Thompson et al. ............ 367/103 |
| 5,974,884 | A | * | 11/1999 | Sano et al. ........................ 73/589 |
| 6,037,704 | A | * | 3/2000 | Welle ............................. 310/339 |
| 6,467,138 | B1 | * | 10/2002 | Aime ............................ 29/25.35 |
| 7,119,800 | B2 | * | 10/2006 | Kent et al. ...................... 345/177 |
| 2005/0007882 | A1 | * | 1/2005 | Bachelor et al. ............... 367/103 |
| 2005/0201205 | A1 | | 9/2005 | Chavez et al. |
| 2008/0258841 | A1 | | 10/2008 | Sherrit et al. |
| 2010/0066207 | A1 | * | 3/2010 | Saito ............................. 310/335 |

OTHER PUBLICATIONS

Haller, et al., "Tapered Acoustic Matching Layers," 1993 IEEE Ultrasonics Symposium, pp. 505-508.

Hossack, et al., "Assessment of Different Pillar Geometries for 1-3 Composite Transducers Using Finite Element Analysis," 1990 IEEE Ultrasonics Symposium, pp. 389-392.

Sato, et al., 'Experimental Investigation of Phased Array Using Tapered Matching Layers, 2002 IEEE Ultrasonics Symposium, pp. 1235-1238.

Yin, et al., "Geometry Effect on Piezo-Composite Transducers With Triangular Pillars," 2008 IEEE International Ultrasonics Symposium Proceedings, pp. 1421-1424.

International Preliminary Report on Patentability and Written Opinion received for Patent Application No. PCT/GB2013/050014, mailed on Jul. 24, 2014, 8 pages.

* cited by examiner

No Binary Grating Case

Bond line, 76 = ½ $\lambda_b$
3 dB bandwidth= 2.2MHz, centred 40MHz

Binary Grating Case

Bond line, 76 = ½ $\lambda_b$ thick
3 dB bandwidth= 24.8MHz, centred 40MHz

No Binary Grating Case

Bond line 76' = 10 λb thick
3dB bandwidth= 0.1MHz, centred 40MHz

Binary Grating Case

Bond line 76' = 10 λb thick
3dB bandwidth= 10.9MHz, centred 40MHz $h = 0.91 \lambda_b$ $h = 1 \lambda_b$ $h = 1.5 \lambda_b$ $h = 2 \lambda_b$ Grating height, h = 0.91 $\lambda_b$ at 40 MHz Grating height, h = 1.5 $\lambda_b$ at 40 MHz Grating height, h = 2 $\lambda_b$ at 40 MHz Grating height, h = 2.5 $\lambda_b$ at 40 MHz

Fig. 16

| Case Scenario | No Sub-λ Grating(s) | Binary Grating(s) | Pyramidal Grating(s) |
|---|---|---|---|
| Case 1 - $f_c$ = 3.5 MHz Steel/Fresh water Interface | | Grating height = 154 µm<br>Grating pitch = 340 µm<br>column width = 133 µm | Grating profile height = 423 µm<br>Grating pitch (Max) = 340 µm<br>Tessellated square bases |
| Min Transmission Loss | 8.9 dB | 0 dB @ 3.5 MHz | 0.04 dB @ 3.5 MHz |
| 3dB Fractional Bandwidth | Flat frequency response | 48 % ($f_{c6dBhi}$ = 3.5 MHz) | 57 % ($f_{c6dBhi}$ = 3.4 MHz)† |
| Case 2 - $f_{centre}$ = 40 MHz Steel/Adhesive/Steel Interface | Bond layer thickness = 103 µm<br>≡ 2½ λ @ 40 MHz | Grating 1 profile height = 14.7 µm<br>Grating 1 Pitch = 34.7 µm<br>Column width = 3.6 µm‡<br>Bond layer thickness = 113 µm<br>≡ 2.75 λ @ 40 MHz<br>Grating 2 height = 14.7 µm<br>Grating 2 pitch = 34.7 µm<br>Column width = 13.6 µm‡<br>‡ For pitch 34.7 µm grating | Grating 1 profile height = 82 µm<br>Grating 1 pitch = 34.7 µm<br>Bond layer thickness = 113 µm<br>≡ 2.75 λ @ 40 MHz<br>Grating 2 profile height = 82 µm<br>Grating 2 pitch = 34.70 µm<br>Profile height = 2 λ @ 40 MHz |
| Min Transmission Loss | 0 dB | 0 dB @ 40 MHz | 0 dB @ 40 MHz |
| 3dB Fractional Bandwidth | 1.1 % ($f_{centre}$ = 40 MHz) | 37 % ($f_{centre}$ = 40 MHz) | 108 % ($f_{c6dBhi}$ = ~30.8 MHz)‡‡ |

† Lower frequency 3dB limit is set by intrinsic reflection loss for 1 acoustic wavelength (in water) high grating structure.
Upper frequency 3dB limit is set by the pitch of pyramidal grating structure set to operate out to 4.35 MHz.
‡‡ Lower frequency 3dB limit is set by intrinsic reflection loss for 2 acoustic wavelength (typical adhesive) high grating structure.
Upper frequency 3dB limit is set by the pitch of pyramidal grating structure set to operate out to 47.4 MHz.

Table 2 : Optimised Designs for steel/ water and steel/ adhesive/steel interfaces Case 1 - Function: transmitting acoustic waves through a steel barrier into water Case 2 - Function: Transmitting acoustic waves between two transducers bonded to separated substrates, and where the substrates are bonded together with adhesive

TRANSDUCER ARRANGEMENT The present invention relates to a transducer apparatus, a plate provided with protrusions for use with such an apparatus, and a method for arranging a transducer unit at a substrate.

In the field of communications it is known, for example, from the applicant's earlier published application WO2008/075092, to mount a transducer at a substrate so as to transmit and/or receive data carried by means of acoustic waves. Thus the transducer can contribute to the establishment of a communications link. A diagram of such a general acoustic communications link is shown in FIG. 1.

In the field of medical imaging it is known, for example from the paper 'Experimental Investigation of Phase Array using Tapered Matching Layers' 2002 IEEE Ultrasonics Symposium pp 1235-1238, by Shohei Sato et al, to form a tapered matching layer from a grating (the grating being formed from an array of pyramidal structured protrusions).

According to a first aspect of the present invention, there is provided a transducer apparatus for acoustic communications through a substrate at a predetermined centre frequency, the apparatus comprising:—an active piezoelectric element for generating an acoustic signal; an intermediate layer, having a surface for accommodating the piezoelectric element, and having a first array of protrusions on a surface opposite the surface for accommodating the piezoelectric element; and a second array of protrusions at the substrate, wherein the active piezoelectric element is mounted onto the intermediate layer, and the intermediate layer is secured in position relative to the substrate such that the first array of protrusions faces the second array of protrusions such that the acoustic signal may propagate through the first and second arrays.

The provision of such protrusions tends to mitigate reflection loss between media of different acoustic impedances. In turn, the mitigated reflection losses tend to widen the bandwidth of the communications channel.

Consequently, more design flexibility is provided where choosing the material between the substrate and the transducer unit. Further, more design flexibility is offered in choosing the thickness of this material, which thickness is equivalent to the separation between the intermediate layer and the substrate. This material may be referred to as the inter-arrays medium because it generally occupies the space separating the first and second array (as well as typically occupying any interstitial spaces within the array itself).

In particular, greater thicknesses of inter-arrays medium may be provided without significantly reducing the bandwidth of the communications offered by the transducer.

A result of providing a thicker inter-arrays medium is that where the medium is used to mount/bond the transducer to the substrate (e.g. where the medium is an adhesive), the thickness reduces the tendency for strains at the substrate to be transferred to the transducer element. Thus, by providing the protrusions, the transducer apparatus is capable of maintaining a wideband operation whilst attached to a substrate that is exposed to large amounts of strain.

A substrate that may be exposed to high strain would be for example a pressure vessel such as a pipe or submarine hull.

Further, the apparatus can be suitable for transmitting data across interfaces between media having markedly different acoustic impedances. For example, the transducer apparatus may be suitable for transmitting acoustic signals through water into a metallic substrate (where water is the inter-arrays medium).

A further result of providing a thicker layer of inter-arrays medium is that it reduces the potential impact of particulate contamination of the bonding layer between the transducer unit and the substrate, and also reduces the substrate flatness requirements.

Typically the first array of protrusions are dimensioned and arranged such that the distance between the median point on a first first-array protrusion and the median point on an adjacent first-array protrusion is less than the wavelength of an acoustic wave in the intermediate layer at the predetermined frequency, and/or the second array of protrusions are dimensioned and arranged such that the distance between the median point on a first second-array protrusion and the median point on an adjacent second-array protrusion is less than the wavelength of an acoustic wave in the substrate at the predetermined frequency.

By thus selecting this median point spacing, i.e. the pitch of the protrusions (or the centre-to-centre distance between protrusions), the protrusions can tend to prevent the creation of substantial diffracted modes being generated. Both the first and second array of protrusions may be so dimensioned and arranged.

In general, and as discussed above, there will be an inter-arrays medium between the first and second array of protrusions. This medium may be an adhesive or may be a fluid such as water. Typically, the distance between the median points on the first and adjacent protrusions should also be less than the wavelength of the acoustic wave in this medium at the predetermined frequency—as such the pitch will be less than the wavelength in both adjoining media at the relevant interface. Such a pitch may be referred to as sub-wavelength.

In some embodiments the first or second array of protrusions comprises binary protrusions, each binary protrusion extending generally perpendicularly from the surface at the substrate or intermediate layer and having a generally constantly-shaped cross section along the axis of the extension.

As such, the protrusions tend to have the form of pillars where the constantly-shaped cross section may be a rectangular cross section and in particular may be a square cross section.

The applicant has determined that such protrusions can tend to optimise the reduction of the transmission loss.

In some embodiments the first or second array of protrusions comprises multi-step protrusions, each multi-step protrusion having a first step extending generally perpendicularly from the surface at the substrate or intermediate layer, the first step having a first shaped cross section, the first shaped cross section being generally constantly-shaped along the axis of the extension and having a second step extending from the first step, the second step having a second shaped cross section, the second shaped cross section being generally constantly-shaped along the axis of the extension, the second step having a smaller cross sectional area than the first.

In other embodiments the first or second array of protrusions comprises tapered protrusions, each tapered protrusion extending from the surface at the substrate or intermediate layer and having a base with a first cross section shape, and extending along the axis of the extension from the base to a second cross-section shape, and continuously tapering between the base and the second section shape.

Depending on the manufacturing process employed to form the protrusions, it may be more convenient to form tapered protrusions rather than stepped protrusions (and vice versa).

The tapered change in cross-section of the protrusion, and thus acoustic impedance, can suppress the periodic variation in acoustic reflections. Such suppression may not be offered by the protrusions having constant cross-sectional area.

The tapered protrusions may be substantially adjacent and arranged to tessellate.

The second cross-section shape may be a point such that the protrusion has the form of a pyramid.

The applicant has determined that such protrusions can reduce the transmission loss, especially where the bases of the pyramids are either square or equilateral triangles and arranged to tessellate.

For a given height and separation, the frequency transmission performance of the resulting triangular or square based pyramidal structure tends to be identical.

The predetermined centre frequency may be within the range 1 MHz to 100 MHz. As such, the apparatus can tend to offer a high bit rate communications channel.

A layer of adhesive may be provided between the intermediate layer and the substrate, and the adhesive may have a thickness equal to at least a third of the wavelength of the signal predetermined centre frequency in the adhesive.

As such the layer of adhesive represents the inter-arrays medium. The applicant has determined that this thickness can ensure a good bond even as the substrate undergoes considerable strain. In particular, such thicknesses can, for a 30 mm×30 mm bond area between a steel substrate and an adhesive, tolerate a high strain (perhaps as much as $10^{-3}$) and as such may be suitable for use on high pressure vessels such as submarines or deep sea pipelines.

According to a second aspect of the present invention, there is provided a method of arranging a transducer unit at a substrate, for acoustic communications through the substrate, comprising the steps of:—forming a first array of protrusions at a surface of the substrate; providing a transducer unit for generating or receiving an acoustic signal at a predetermined centre frequency; forming a second array of protrusions upon a surface of the transducer unit; fixing the transducer unit relative to the substrate such that the transducer unit is arranged to receive/transmit acoustic signals via the first and second array of protrusions into/out of the substrate.

Such a method enables a low-loss acoustic transmission apparatus to be fitted to a substrate. In particular, there may be little adaptation of the pre-existing substrate necessary and so the method promotes retrofitting of the communications apparatus onto legacy substrates.

The method may further comprise the step of providing a regularly spaced first array and dimensioning the first array such that the distance between the median point on a first protrusion and the median point on an adjacent protrusion is less than the wavelength of an acoustic wave in the substrate at the predetermined frequency.

As such, the protrusions can tend to prevent the creation of substantial diffracted modes being generated at the substrate. An equivalent provision may be taken at the second array to tend to prevent the generation of substantial diffracted modes at the transducer unit.

The transducer unit may comprise an active piezoelectric element and an intermediate layer, the step of forming the second array of protrusions comprising forming the second array of protrusions on the intermediate layer.

The provision of an intermediate layer can enable a highly precise bond with generally minimised reflection loss between the active piezoelectric element and the intermediate layer. Moreover, the intermediate layer can be sized so as to be suitable for working in a clean room environment, which the substrate may not be suitable for.

As such the intermediate later can provide a practical intermediate assembly in the mounting process.

Generally the step of forming protrusions is by embossing a surface on the transducer unit or substrate.

An embossing operation may easily be repeated and as such may enable various mountings to be made on a substrate in a convenient timeframe and, provided a portable stamp is used to perform the embossing operation, may enable a large substrate to be conveniently prepared for mountings.

Either step of forming the protrusions may comprise: i) attaching a covering at the surface of the substrate or intermediate layer, ii) forming the protrusions at the covering. Where the protrusions are so formed, typically the substrate is steel and the covering is formed from copper.

Copper has an acoustic impedance close to that of steel and thus is suitably impedance matched. Further, the copper is a material at which surface protrusions can be formed, which is softer than steel. Thus the use of a copper covering during forming, e.g. embossing, can enable the forming to be achieved using less energy. Thus the possibility of performing the protrusion-forming process at the substrate tends to become feasible (as opposed to needing to move the substrate to the protrusion forming equipment). This on-site protrusion-forming tends to reduce costs and time, especially where the substrate is large and heavy or otherwise difficult to move.

According to a third aspect of the present invention there is provided a plate comprising an array of protrusions for mitigating acoustic impedance loss in a transducer apparatus operating at a predetermined centre-frequency, and in an environment comprising a predetermined medium, wherein the array of protrusions are dimensioned and arranged such that the distance between the median point on a first protrusion and the median point on an adjacent protrusion is less than the wavelength of an acoustic wave in the plate at the predetermined centre-frequency, and is less than the wavelength of an acoustic wave in the predetermined medium at the predetermined centre-frequency.

The predetermined medium may be a fluid, and in particular may be water such that the metal plate may be provided in a sonar system.

The protrusions may be pyramids, provided with bases for tessellating, and being arranged to tessellate at their bases, wherein each pyramid has a height equal to or greater than 0.8 times the wavelength of the signal at the predetermined centre frequency in the predetermined medium.

As such, the protrusions are well suited for providing a wider communications bandwidth as an acoustic signal propagates from the fluid to a steel substrate. The predetermined fluid may be water and as such the metal plate may be used for sonar.

Further, each pyramid may have a height equal to or greater than 1.5 times the wavelength of the signal at the predetermined centre frequency in the predetermined medium.

Generally the plate is formed from metal.

So that the invention may be well understood, at least one embodiment thereof will now be described with reference to the following figures, of which:—

Figure 9A:
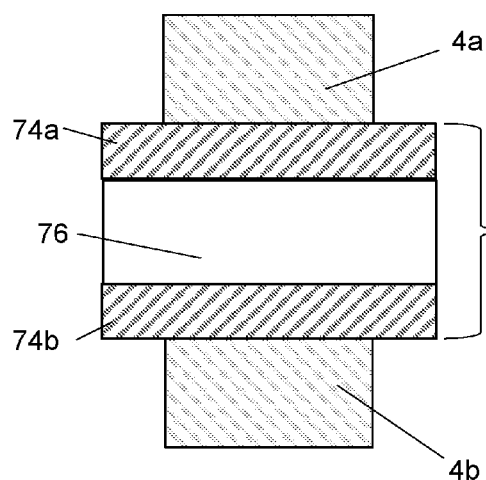
Figure 10A:
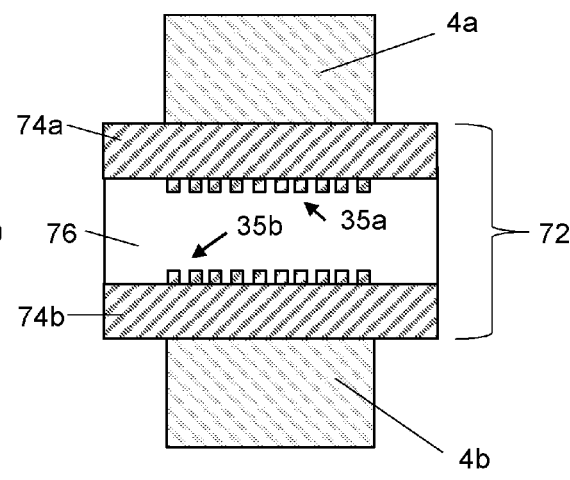
Figure 9B:
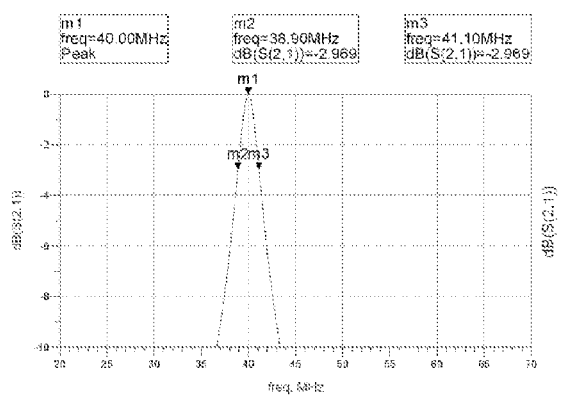
Figure 10B:
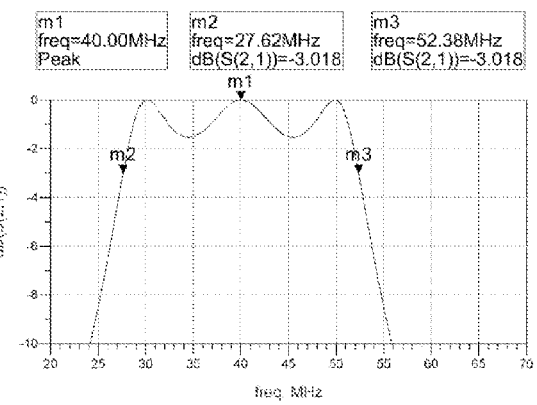
Figure 12A:
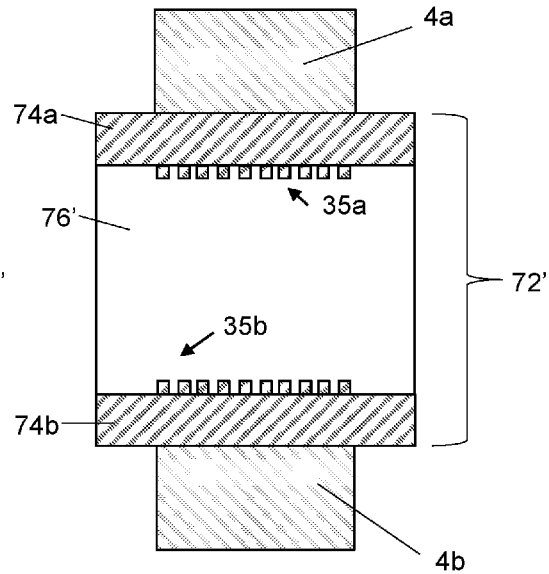
Figure 13A:
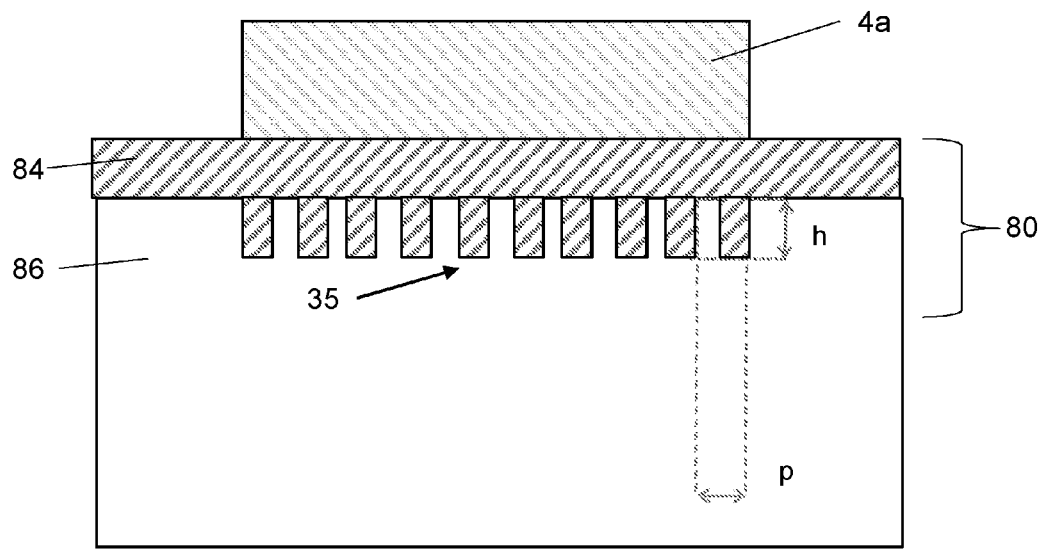
Figure 13B:
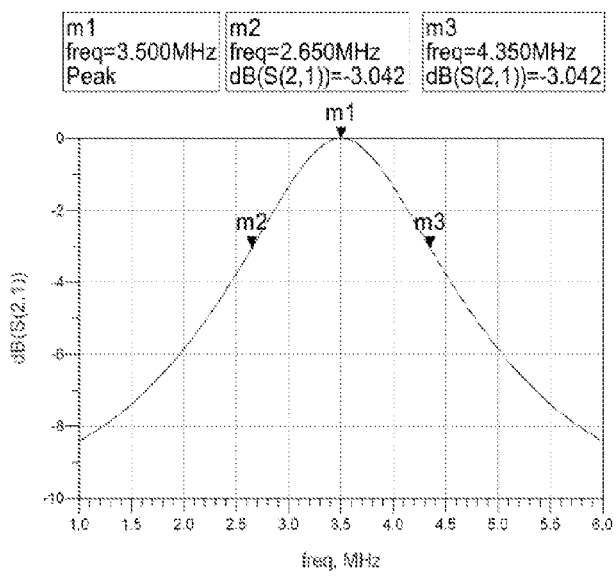

FIGS. 9a, 9b, 10a and 10b show the simulated influence of an array of binary protrusions on the communications bandwidth between transducers over a steel to adhesive to steel barrier, and in particular FIG. 9a shows schematically the model implemented in the simulation to obtain the results shown in FIG. 9b and FIG. 10a shows schematically the model simulated to obtain the results shown in FIG. 10b;

FIGS. 11a, 11b, 12a and 12b show the simulated influence of an array of binary protrusions on the communications bandwidth between transducers over a steel to adhesive to steel barrier similar to those in FIGS. 9a to 10b, but having a thicker layer of adhesive;

FIGS. 13a and 13b show the simulated transmission of an acoustic signal into a medium comprising a steel layer, a binary array and an infinite water layer;

FIGS. 14a-14e show the simulated influence of four different heights of first pyramidal arrays on the transmission loss of an acoustic signal in a medium comprising a steel layer, the pyramidal array and into an infinite water layer;

FIGS. 15a-15e show the simulated influence on transmission loss of differing array layer depths for a communications link having pyramidal protrusion arrays; and FIG. 16 is a table summarising optimised protrusion characteristics for specific operational scenarios.

Figure 2:
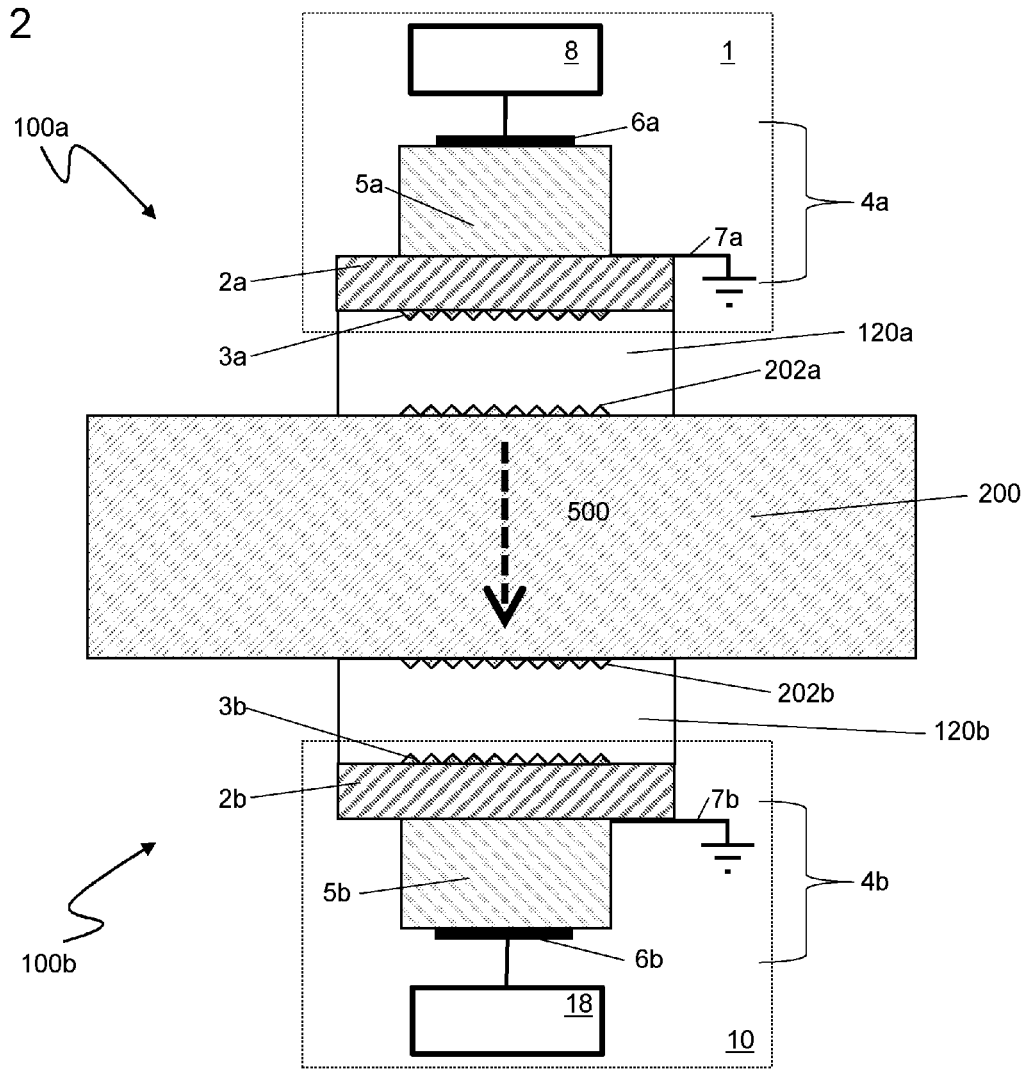
FIG. 2 shows a schematic representation of an embodiment of a transmit transducer apparatus and a receive transducer apparatus according to the present invention.

Referring to FIG. 2, a first and second transducer apparatus, 100a and 100b are mounted either side of a substrate or barrier 200.

The first transducer apparatus 100a is configured to transmit data using a generated acoustic signal 500. Apparatus 100a comprises a transducer unit 1 separated from and bonded to the substrate 200 by means of an adhesive layer 120a. However in other embodiments, where the transducer unit is otherwise secured in position relative to the substrate, the adhesive layer 120a may be replaced by a fluid layer.

The transducer unit 1 comprises an active element 4a which is driven by a signal generator or function generator 8. The active element 4a is mounted directly onto a first surface of a carrier plate 2a (which may also be referred to as an intermediate plate 2a). An electrical impedance matching circuit (not shown) is provided for electrically interfacing the signal generator 8 with the active element 4a.

The carrier plate 2a, which may alternatively be referred to as an intermediate layer 2a, is provided with a layer having an array of protrusions 3a. This layer of protrusions 3a is on a second surface of the carrier plate 2a such that this layer is opposite the first surface where the active element 4a is mounted.

The active element 4a is further comprised by a piezoelectric element 5a sandwiched between a live electrode 6a and a ground electrode 7a. The live electrode 6a is electrically connected to the function generator 8.

The first transducer apparatus 100a also comprises a further layer of protrusions 202a which is applied to, or otherwise provided at, the substrate surface 200. The further layer of protrusions 202a on the substrate 200 is arranged to face the layer of protrusions 3a at the carrier plate 2a.

The overall arrangement of the active element 4a, the carrier plate 2a, the carrier plate protrusion layer 3a, and the substrate protrusion layer 202a is such that the main lobe of an acoustic signal generated by the active element 4a will tend to pass through firstly the protrusion layer 3a, secondly the inter-arrays medium (e.g. the adhesive layer 120a) and thirdly the protrusion layer 202a, prior to propagating onwards into the substrate 200. The acoustic signal 500 is configured to be a highly collimated beam of longitudinal mode waves.

However in alternative embodiments requiring a broad angular field of view between sender and receiver transducers, the acoustic signal could be a highly spreading beam of longitudinal waves. A requirement for a broad angular field of view would arise for example where the sender and receiver transducers are likely to be misaligned (e.g. off bore-sight and/or not parallel).

However, in the FIG. 2 configuration, this face-to-face arrangement of the protrusion layers is achieved by providing that the protrusion layers 3a, 202a are each generally planar, are both of the same dimensions, and are both parallel to, and projecting onto, one other.

The second transducer apparatus 100b is configured to receive data from the acoustic signal 500. The second apparatus 100b is largely identical to the first apparatus 100a. Accordingly equivalent components are given the same reference numeral, but with a 'b' suffix as opposed to an 'a' suffix.

However one difference is that whereas in the first apparatus 100a the active element 4a of the transducer unit 1 is driven by a function generator 8, in the second apparatus 100b the active element 4b of the transducer unit 10 is connected to a signal processor 18. Further, an electrical impedance matching circuit (not shown) specifically configured for use in the second apparatus 100b is provided for interfacing the signal processor 18 with the active element 4b.

Figure 4:
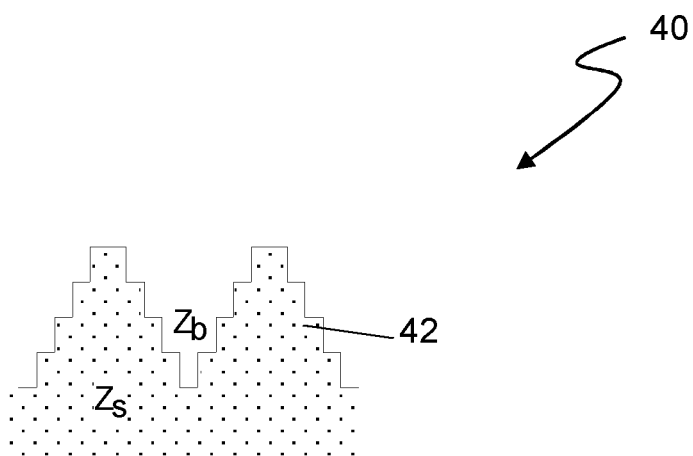
FIG. 4 shows a profile of a 'multi-step' form of protrusion array for the apparatus of FIG. 2.
Figure 5:
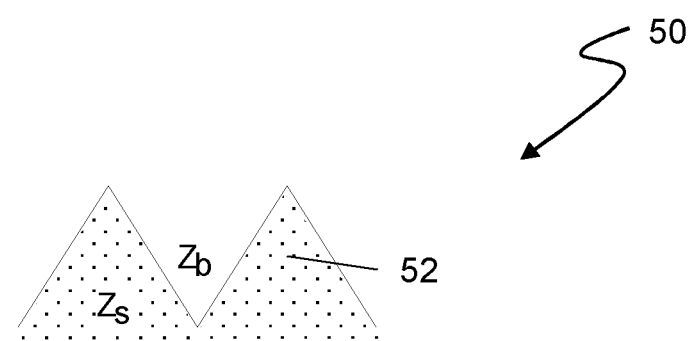
FIG. 5 shows a profile of a 'tapered' form of protrusion array for the apparatus of FIG. 2.

The surface protrusion layers 3a, 3b, 202a and 202b may have various forms but generally will have the form of an array of protrusions (such an array of protrusions may alternatively be referred to as a grating). Three of the various protrusion layer profiles contemplated by the present application are shown in FIGS. 3, 4 and 5.

Figure 3:
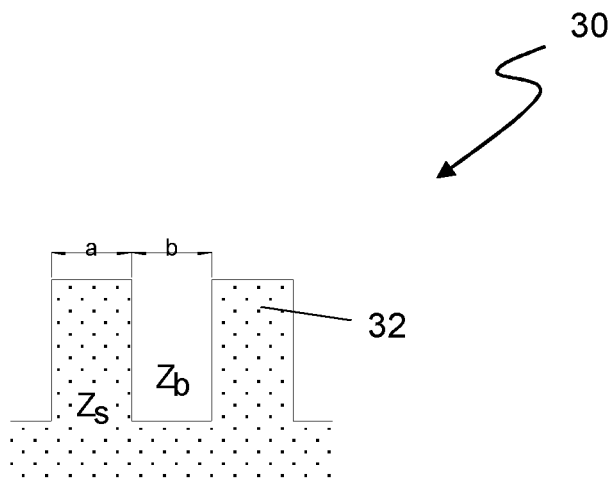
FIG. 3 shows a profile of a 'binary' form of protrusion array for the apparatus of FIG. 2.

A 'binary' profile for a protrusion layer is shown in FIG. 3 and has a generally square wave form which is repeated at regular intervals. As such the binary profile tends to provide flat-topped protrusions 32 extending generally perpendicularly from the surface of the substrate 200 (or carrier plate 2a, 2b) which have a constant rectangular cross-section along the extension axis. The width of the protrusion is a, and the interstitial width is b. As such, the period of the protrusions, which may alternatively be referred to the distance between the median points on adjacent protrusions, or as the centre-to-centre distance, or as the pitch, p, is the sum of a and b (i.e. p=a+b).

Figure 6:
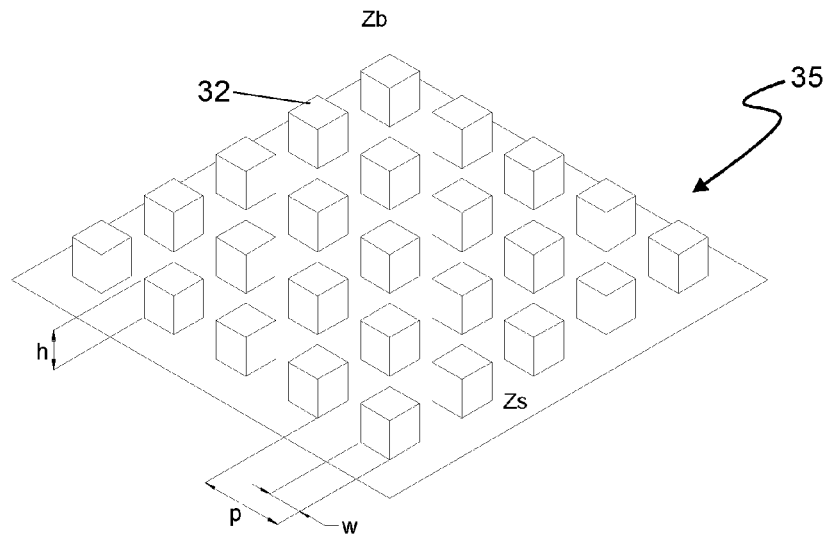
FIG. 6 shows an isometric representation of an array of binary protrusions.

A 5×5 array 35 of binary protrusions 32 is shown in FIG. 6. The protrusions are substantially cube-shaped and as such their height h (i.e. the maximum protrusion extension from and perpendicular to the surface) is approximately equal to their width, w. The protrusions are arranged regularly.

Whereas in the binary embodiment of FIG. 6, the protrusions have rectangular cross-sections (perpendicular to the axis of extension), the cross-sectional shape of the protrusions/pillars forming the binary grating need not be rectangular in alternative embodiments. For example in alternative arrangements the pillars could have triangular or circular cross-sections. Further, the arrays may not be regular; however regular arrays of square, rectangular or triangular cross-sectional pillars could potentially be cut using an appropriate wafer sawing action, which would be a convenient forming operation.

The binary protrusions shown in FIG. 6 as approximately cube-shaped are suitable when acoustically matching a steel substrate with an adjacent adhesive or water medium. For other mediums, the rectangular profiles may be tall and thin, or low and squat depending on the velocity and densities of the materials being impedance matched.

A 'multi-step' profile for a protrusion layer is shown in FIG. 4 as having a stepped pyramidal form. As such the multi-step profile tends to provide protrusions 42 extending generally perpendicularly from the surface of the substrate 200 (or carrier plate 2a, 2b). Each multi-step protrusion 42 comprises a plurality of similarly-deep steps, each extending for that depth with a generally constantly-shaped cross-section (in particular a rectangle), with each successive step away from the surface of the substrate (or carrier plate 2a, 2b) having a smaller cross-section so as to form the tapered step form shown in FIG. 4. For a given height of multi-step protrusion 42, as the number of steps tends to infinity and/or the step depth tends to zero, the stepped pyramidal profile approximates to the 'tapered' profile of protrusions 52 shown in FIG. 5 which has the general form of a triangular wave.

The individual profiles shown in FIG. 4 and likewise in FIG. 5 and indeed FIG. 3 are symmetrical about a vertical axis. However in alternative profiles, the profiles may be asymmetrical and achieve similar performance. Tilted or asymmetric forms of protrusions that have the same variation in cross-sectional area as a function of height above the surface of the substrate would perform identically provided the pitch of the protrusions was sub-wavelength.

A 'tapered' profile for a protrusion layer is shown in FIG. 5 as having the general form of a triangular wave. As such the tapered profile tends to provide protrusions 52 extending from a base at the surface at the substrate or intermediate layer to a higher point. The higher point is a point of negligible dimensions and the protrusion continuously tapers between the base and the higher point.

Figure 7:
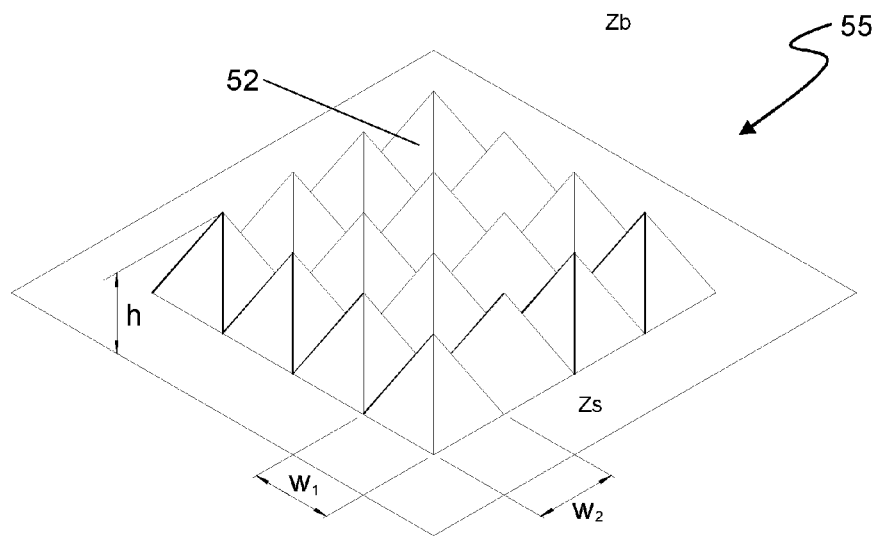
FIG. 7 shows an isometric representation of an array of pyramidal tapered protrusions.

A first array 55 of the 'tapered' profile protrusions is shown in FIG. 7. Here, the base of each protrusion has a first polygonal cross-section (in this instance a square). In general for such arrays, the higher point may be a point of negligible dimensions or at least a section of the protrusion with a cross-sectional area less than the base.

For simplicity and clarity, the array of protrusions shown in FIG. 7 is a 4×4 array; arrays with greater numbers of protrusions could clearly be envisaged given this starting point. In array 55, each protrusion tapers (equally on all sides) from a square base to a point and as such each protrusion has the form of a square based pyramid. Moreover, the bases of these square based pyramids are arranged to tessellate and as such there is no interstitial space between the bases. Where the bases tessellate, the width of the base is equal to the protrusion array pitch. The absence of any interstitial space permits the provision of a smoothly varying change in acoustic impedance from that of the substrate to that at the tips of the tapered profile. With the bases of the protrusions tessellating, the protrusions represent a tiling for the surface.

Figure 8:
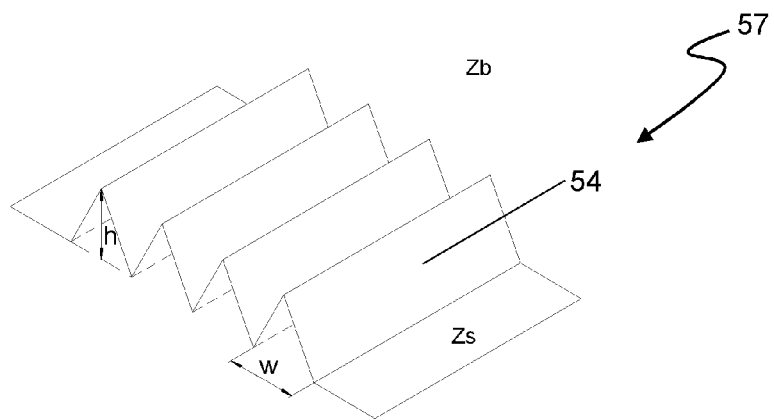
FIG. 8 shows an isometric representation of an array of ridged tapered protrusions.

A second array 57 of the tapered profile protrusions is shown in FIG. 8. In array 57, the base of the protrusion has the form of an elongated rectangle and as such, the array has the form of ridges. The base of ridge protrusions 54 tessellate; the protrusions 54 tile the surface.

In general operation, the transmit acoustic apparatus 100a shown in FIG. 2 transmits data as follows. First the active element 4a is driven with a signal from the function generator 8. Typically for use in communications links, the signal will have a centre frequency in the range of 1-100 MHZ, and more typically in the range of approximately 3 MHz to 55 MHz. The voltage subsequently set up across the piezoelectric element 5a causes the element 5a to vibrate. The vibrations generated by the element 5a effect a longitudinal acoustic wave, i.e. signal 500, which propagates into and through the carrier plate 2a, then into and through the inter-arrays medium (i.e. the bond layer 120a), and then into the substrate 200.

The acoustic signal propagates through the substrate 200, then the bond layer 120b, then the intermediate layer 2b, before reaching the piezoelectric element 5b. Upon arriving at the piezoelectric element 5b, the acoustic signal 500 vibrates the active element 5b, which sets up a voltage across the electrodes 6b and 7b. This voltage is detected by the signal processor 18. Thus the receiving acoustic apparatus 100b receives data via the acoustic signal 500

The quality of the communications link can be affected by differences in acoustic impedances at the interfaces between different materials of the apparatus. Generally the transducer (often PZT) and the substrate (often a metal such as steel) will have a higher acoustic impedance compared to the medium therebetween (typically an adhesive if the medium functions to mount the transducer to the substrate, otherwise typically water or oil).

Any interface between two media with different acoustic impedances $Z_1$ and $Z_2$, will generally reflect some of the energy incident on the interface. The transmission loss $T_{loss}$ for energy transmitted across a single and isolated interface, for the specific case of an acoustic wave incident at normal incidence, is given by:

$$T_{loss} = \frac{4Z_1 Z_2}{(Z_1 + Z_2)^2}$$

Where the acoustic impedances $Z_1$ and $Z_2$ are as defined by the product of the media's respective densities and velocities.

Figure 1:
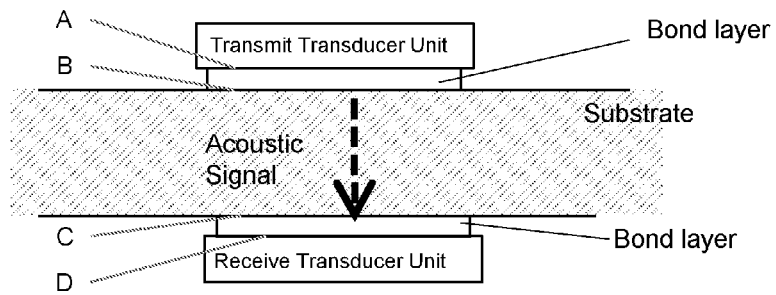
FIG. 1 shows a schematic representation of a generalised acoustic communications link comprising a receive transducer unit and a transmit transducer unit mounted either side of a substrate.

In a prior art transducer arrangement such as shown in FIG. 1, it may be common for the propagating acoustic wave 500 to lose energy as the wave crosses the transducer-to-bond interface A and/or as the wave 500 crosses the bond-to-substrate interface B and/or as the wave 500 crosses the substrate-to-bond interface C and/or as the wave 500 crosses the bond-to-transducer interface D.

When these interfaces are parallel, the net transmission loss across the combined structure is determined by interference effects between the different waves reflected by each interface, which can lead to a narrow band signal transmission performance. In the prior art transducer arrangement of FIG. 1, such signal transmission losses have been suppressed by making the thickness of the bond small compared to that of an acoustic wavelength within the bond material, specifically less than ~1/100 acoustic wavelengths for the case of two steel materials (i.e. the substrate and the transducer unit exterior) bonded together with an adhesive layer. Achieving sufficiently thin acoustic bonds becomes more difficult at higher frequencies.

Generally any reflection of waves at the interfaces not only diminishes the amplitude of the propagating wave, but can also lead to interference effects in the transmitted signal.

In the present invention, the protrusion layer 3a is provided at the carrier plate-to-bond interface (which is in effect the interface between the transducer and the bond), the protrusion layer 202a is provided at the bond-to-substrate interface, the protrusion layer 202b is provided at the substrate-to-bond interface, and the protrusion layer 3b is provided at the bond-to-carrier plate interface (which is in effect the interface between the bond and the transducer).

Each protrusion layer comprises an array of protrusions for mitigating the reflection loss and the general form of some exemplary arrays has been discussed above.

The applicant has simulated the performance of certain protrusion arrays, particularly with a view to determining the extent to which the bandwidth of the apparatus may be improved.

The applicant has exploited the fact that it is possible to model the transmission behaviour of an acoustic wave propagating between media of differing acoustic impedances, using an electrical equivalent circuit model. For example, the wave transmission properties of a layer with uniform acoustic impedance and a defined thickness in acoustic wavelengths can be represented by an electrical transmission line. Thus the simulations were done making use of Effective Medium Theory (EMT) which allows the acoustic properties of a structured interface to be represented by a stack of homogenous layers whose properties are the volumetric average of the properties of the two interconnected media within the plane of each layer, provided the protrusions are spaced by less than one acoustic wavelength (in either media) and thus suppress the appearance of grating diffraction modes. The simulations were then analogously implemented within the ADS electrical circuit simulation software supplied by Agilent Technologies (Agilent Technologies Ltd, 5 Lochside Avenue, Edinburgh Park, Edinburgh, EH12 9DS, UK).

Referring to FIG. 6, the acoustic impedance $Z_p$ of the protrusion layer (i.e. binary array 35) is equal to the volumetric average of the impedances $Z_s$ of the material making up the rectangular columns (i.e. protrusions 32) on the substrate, and the impedance $Z_b$ of the filling material (i.e. the material filling the spaces within the protrusion layer between the protrusions themselves) and is for this specific geometry given by:

$$Z_p = k^2 Z_s + (1-k^2) Z_b$$

Where
k=w/p

And likewise the effective acoustic velocity within the array layer geometry shown in FIG. 6 is given by:

$$V_p = k^2 V_s + (1-k^2) V_b$$

Where $V_s$ and $V_b$ are the acoustic velocities within the material making up the rectangular columns on the substrate and the filling material, respectively. The absolute values of electrical impedances used during electrical-equivalent circuit modelling are of lesser relevance; of more importance is that the ratio of the electrical impedances in the equivalent circuit components should be identical to the ratio of the acoustic impedances that are represented by the equivalent circuit components.

Specifically, a first simulation was done for a transducer to transducer 40 MHz communications link where the acoustic wave was transmitted through a barrier 70 without protrusions as shown in FIG. 9a. The barrier 70 comprised various layers and as such was arranged such that the signal passed through a substrate layer 74a (representing the carrier plate 2a) having an impedance equivalent to 115 Ohms (and therefore approximating to the acoustic impedance of steel 46.28 MRayls), then through a 0.5$\lambda_b$ thick bond layer 76 (where $\lambda_b$ refers to the wavelength of the signal in the filling medium, which medium in this instance is the bond layer 76) having an impedance equivalent to 5 Ohms (and therefore approximating to an adhesive with acoustic impedance 2 MRayls) and lastly through a further steel-approximating substrate layer 74b (representing a substrate such as substrate 200). A schematic representation of this simulated arrangement is shown in FIG. 9a and the frequency response for this arrangement, when tested with a 20 MHz to 70 MHz sweep, is shown in FIG. 9b. The resulting bandwidth of the link was 2.2 MHz, centred at 40 MHz.

Referring to FIGS. 10a and 10b, a second simulation was done for a transducer to transducer 40 MHz communications link, similar to the first arrangement, but here the acoustic wave was transmitted through a barrier 72 with an array of square cross-section binary protrusions 35a and 35b on each of the substrate layers 74a and 74b.

For each array, the protrusions are of 14.7±1.8 microns height, 12.7 microns width, and 31 microns pitch. The pitch value of 31 microns ensures that no diffraction modes are excited at any frequency below 52.4 MHz. The corresponding width of the square cross-section binary protrusions (for the given pitch) yields an acoustic impedance value equal to a theoretically ideal value for a single layer anti-reflection coating between the acoustic impedances of the substrate and the adhesive of:

$$Z_p = \sqrt{Z_s Z_b}$$

The barrier 72 was arranged such that the signal passed through a substrate layer 74a having an impedance equivalent to 115 Ohms (and therefore approximating to steel), into and through a protrusion layer 35a with an impedance equivalent to 24 Ohms (and therefore approximating to the ideal value for a single layer anti-reflection coating) then through a 0.5$\lambda_b$ thick bond layer 76 (representing the inter-arrays medium) having an impedance equivalent to 5 Ohms (and therefore approximating to an adhesive). The wave then passed into a further protrusion layer 35b and lastly through a further steel-approximating substrate layer 74b. A schematic representation of this simulated arrangement is shown in FIG. 10a and the frequency response for this arrangement, when tested with a 20 MHz to 70 MHz sweep, is shown in FIG. 10b. The resulting bandwidth of the link was 24.8 MHz, centred at 40 MHz.

Thus these binary protrusions are shown to improve the bandwidth of the simulated arrangement from 2.2 MHz to 24.8 MHz, for the specific case of a 0.5$\lambda_b$ thick bond layer 76.

The effect of binary protrusions over a thicker adhesive bond layer between transducers is shown in FIGS. 11a, 11b, 12a and 12b. This experimental set-up is similar to that in FIGS. 9a, 9b, 10a and 10b but with a thicker layer of adhesive 76' at the barriers 70' and 72'. In particular, the thickness of the adhesive layer modelled was ten times the wavelength of the operating centre frequency in the adhesive (i.e. 10$\lambda_b$).

Figure 11A:
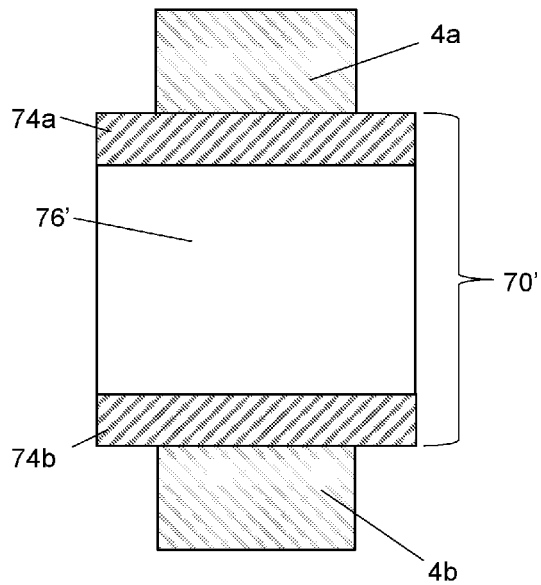
Figure 11B:
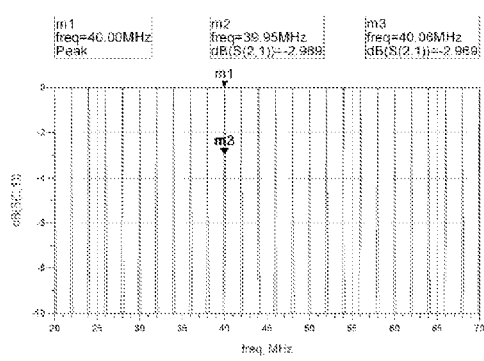
Figure 12B:
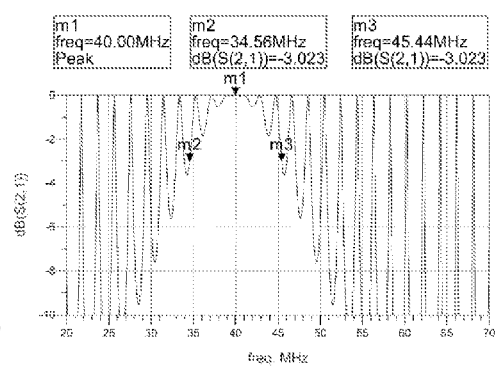

As can be seen from the graph in FIG. 11b, which expresses the signal transmission loss over a thick (10$\lambda_b$) bond layer without carrier plate protrusion arrays, the thicker bond layer 76' can tend to provide a comb-like frequency transmission profile for the communications link such that a few very narrow frequencies may be passed without significant attenuation, but most frequencies are highly attenuated. As such the capacity for any resulting communications channel will tend to be limited; the 3 dB bandwidth is effectively 0.1 MHz about each peak of the comb, including the 40 MHz centre-frequency peak.

However where an array of binary protrusions 35a or 35b, each protrusion extending to a height of 0.25$\lambda_{bp}$ from the surface (where $\lambda_{bp}$ is the effective wavelength in the binary protrusion array, and is calculated from the effective velocity, $V_p$, in the binary protrusion array according to $\lambda_{bp} = V_p/f$), is provided on the steel transmission substrate 74a and the receiver substrate 74b, the comb-like profile is much counteracted around the 40 MHz centre frequency and as such a 3 dB bandwidth of 10.9 MHz may be achieved.

A third simulated model is shown in FIG. 13a. Here the simulation modelled the transmission of a 3.5 MHz centre-frequency acoustic wave propagating from a transducer, into a high (156.25 Ohm) impedance substrate (equivalent to steel), onwards into a binary protrusion layer of 154 microns height (equivalent to $0.25\lambda_{bp}$ at 3.5 MHz in the structure), 133 microns width, and 340 microns pitch, and thus with intermediate (28 Ohm) impedance, and onwards through a low (5 Ohm) impedance termination layer (equivalent to an infinite extent of water such as for example might be probed by a sonar transducer mounted on the non-wet side of the barrier). The transducer is modelled as generating a 3.5 MHz-centred sweep signal from 1 MHz to 6 MHz. The subsequent frequency response plot is shown in FIG. 13b. A 3 dB bandwidth of approximately 1.7 MHz was achieved for efficient coupling into water.

A further set of four simulations was undertaken, as shown in FIGS. 14a to 14e. These further simulations were similar to the third simulated model but with binary protrusions replaced with protrusions approximating to pyramidal protrusions. These approximate pyramidal protrusions were simulated by modelling a multi-step profile with a large number of thin steps. In particular 48 steps were modelled so as to approximate to a tapering, smooth sided pyramid.

As such, the four further simulations modelled a transducer to water acoustic coupling (such as may exist in for example a high frequency short range sonar) where the medium 80 into which the transducer may transmit a signal consisted of a high impedance layer 84 (representing steel), a protrusion layer, and a low impedance layer 86 (representing water). The protrusion layer comprised an array 55 of square-based tessellating pyramidal protrusions and each of the four simulations of this model was undertaken with a different pyramid height. The different heights were equivalent to 0.91, 1, 1.5 and 2 times $\lambda_b$ i.e. the acoustic wavelength of the 3.5 MHz centre-frequency signal propagating through water.

Figure 14A:
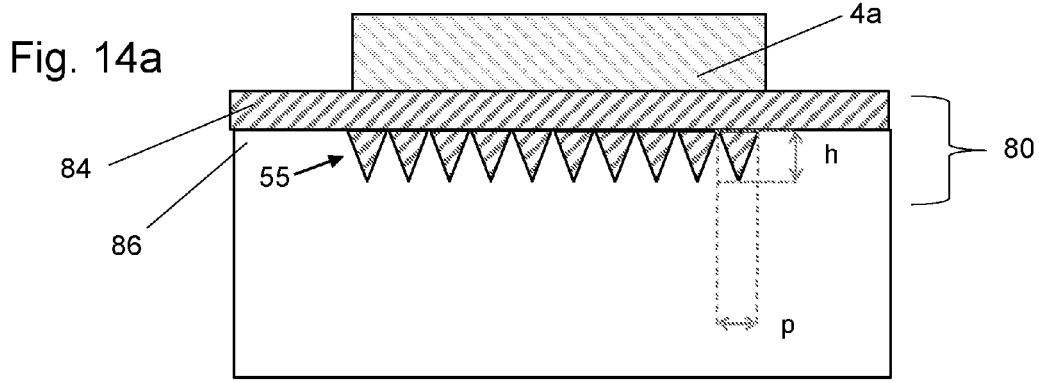
Figure 14B:
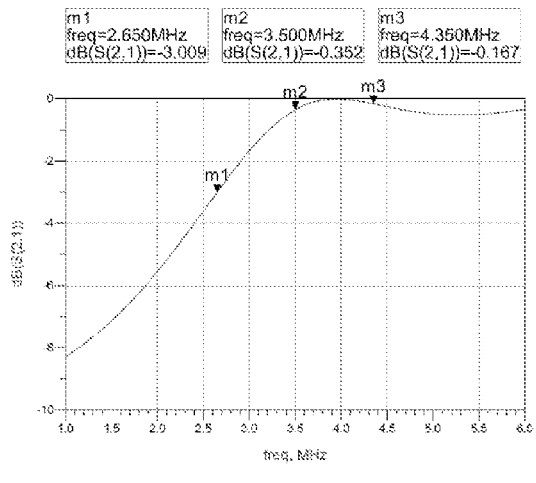
Figure 14C:
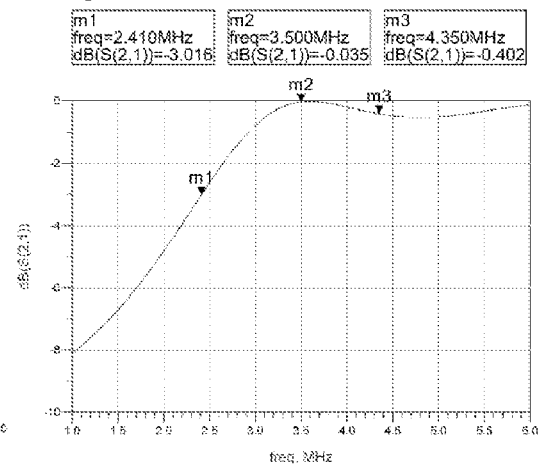
Figure 14D:
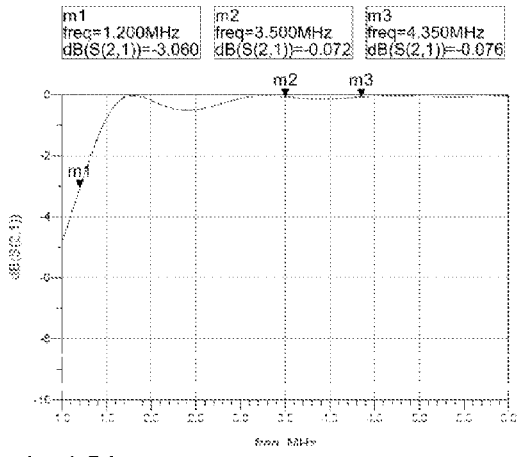
Figure 14E:
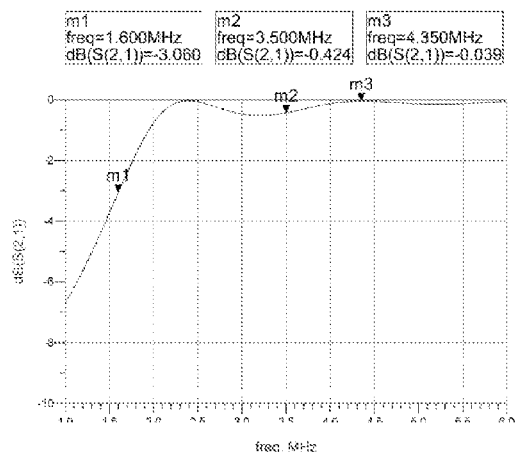

The general model simulated is shown in FIG. 14a and the frequency responses for each pyramid array height when exposed to a 1 MHz to 6 MHz sweep signal is shown in FIGS. 14b (for the $0.91\lambda_b$ height), 14c (for the $1\lambda_b$ height), 14d (for the $1.5\lambda_b$ height) and 14e (for the $2\lambda_b$ height).

The plots show that the low frequency transmission loss improves markedly as the height of the protrusions is increased. Further increase in the height of the protrusion to ~$2.5\lambda_b$ yields less than 1 dB of ripple down to 1.16 MHz.

Figure 15A:
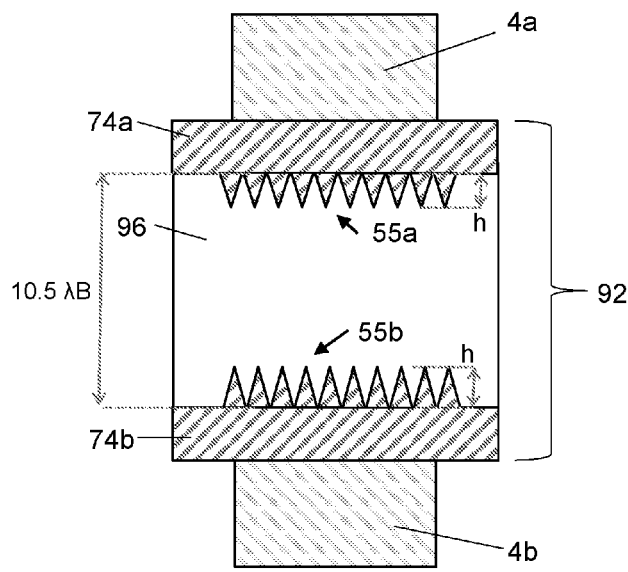
Figure 15B:
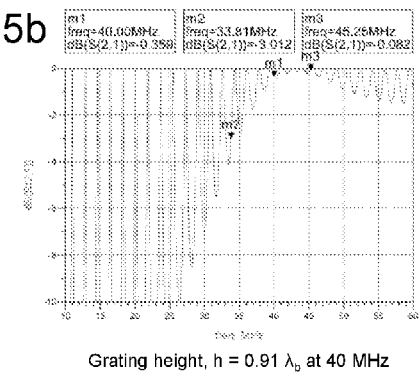
Figure 15C:
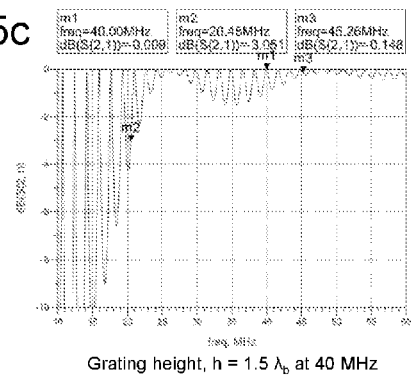
Figure 15D:
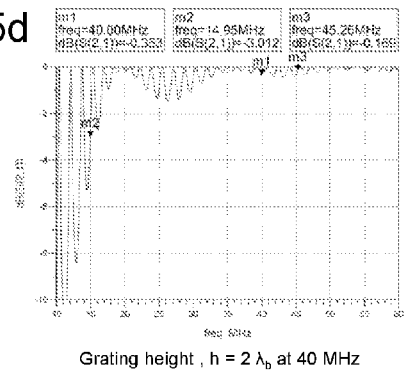
Figure 15E:
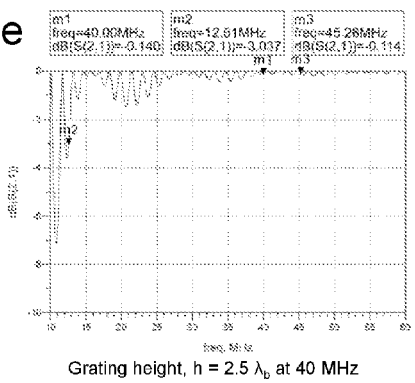

Additionally a further set of four simulations were performed to model the effect of varying the protrusion height, h, for a pyramidal array 55a, 55b at a transducer-to-receiver communications link over a thick barrier 92. The general schematic for the system modelled is shown in FIG. 15a whilst the results for differing protrusion heights $0.91\lambda_b$, $1.5\lambda_b$, $2\lambda_b$ and $2.5\lambda_b$ (where $\lambda_b$ is the wavelength in the inter-arrays medium, in this instance the adhesive layer 96) are shown in FIGS. 15b, 15c, 15d and 15e respectively. For the simulated environment, the material of the carrier plates 74a and 74b was chosen to be steel and the medium 96 was chosen to be a 10.5λ deep layer of adhesive between the plates. The acoustic wavelength at 40 MHz in the adhesive is 41 microns.

The results show that bandwidth can be significantly improved by increasing the protrusion height. A protrusion height equivalent to $0.91\lambda_b$ provides a one-sided 3 dB bandwidth (i.e. below the target operating frequency of 40 MHz) of 6.19 MHz whilst a $1.5\lambda_b$ protrusion height provides an equivalent one-sided 3 dB bandwidth of 19.52 MHz.

For the pyramidal protrusion structures the signal transmission loss function is highly asymmetric. Also the upper one-sided 3 dB bandwidth will be affected by the appearance of diffraction losses associated with appearance of diffraction orders for sufficiently high frequency acoustic waves where the protrusion structure is no longer sub-wavelength.

A table summarising some of the conclusions of the simulations is shown in FIG. 16. For the first case (case 1), the simulations sought to describe the transmission of acoustic waves through a steel barrier into water. Case 1 type simulations were discussed above in reference to FIGS. 13a-b and 14a-e.

For the second case (case 2), the simulations sought to describe the transmission of acoustic waves between two transducers (i.e. a transmitted to receiver communications link) bonded to separated substrates, where the substrates are bonded together with an adhesive. Case 2 type simulations were discussed above in reference to FIGS. 9a, 9b, 10a, 10b, 11a, 11b, 12a, 12b, while FIGS. 15a-e are a Case 2 simulation but with a $10.5\lambda_b$ thick bond layer 96.

The transducer apparatus 100a is assembled according to the following methodology.

As one of the early steps, the carrier plate 2a should be formed and provided with the protrusion array 3a. The carrier plate 2a is a generally planar metal plate with an area for accommodating the active element 4a and a further area for accommodating any electrical matching circuitry for interfacing with the signal processor/generator. The protrusion array 3a is formed on a surface of the carrier plate 2a opposite the surface which accommodates the active element 4a.

The active element 4a is bonded to the carrier plate 2a in a clean environment so that a high precision and thin bond can be achieved. The active element 4a is bonded to the carrier plate 2a at the ground electrode 7a, which has the form of a thin metallised layer.

Protrusions 202a are also formed on the substrate 200 so as to provide the desired protrusion array given the predetermined operational centre-frequency, frequency range and with knowledge of the barrier impedances in the in-service environment.

With the active element 4a mounted on the carrier plate 2a and the protrusions formed on the substrate 200, the transducer unit 1 can be secured in position relative to the substrate 200, for example by mounting.

One method of mounting the transducer unit 1 to the substrate would be to apply a layer of adhesive 120a between the unit 1 and the substrate 200 and then support the substrate 200 and the transducer unit 1 until the adhesive 120a has set.

Alternatively, the transducer 1 may be fixed in relation to the substrate 200 by providing the transducer unit 1 with a housing (not shown). The housing may then be mounted to a fixture which can be relied upon to be static in relation to the substrate 200. The housing should be mounted to the fixture such that the acoustic beam 500 of the transducer 1 is directed perpendicularly towards the protrusion array 202a on the substrate 200.

The step of forming protrusions 3a may involve machining, etching or sawing into the transducer unit or substrate depending on the scale of the protrusions required and the material upon which the protrusions are to be formed.

Forming protrusions could for example be done by a laser micromachining system, such as the 'Alpha' table-top laser as supplied by Oxford Lasers ltd. (Unit 8, Moorbrook Park Didcot, Oxfordshire OX11 7HP, tel: 01235 810088; email: oxford.ltd@oxfordlasers.com). Such a laser could be used to machine the surfaces of a metal carrier plate or metal substrate directly.

Where the protrusions are to be formed on a hard metal such as steel, another method of forming protrusions involves providing a protrusion cover. Such a cover layer is formed from a softer metal with an acoustic impedance equivalent to the hard metal substrate or carrier plate. For example, where the substrate is a steel, the cover layer could be copper.

In mounting the apparatus, the cover layer may first be applied to the surface of the substrate or carrier plate for example by a rotary friction stir welding process, and then be embossed or otherwise worked to form the protrusion array.

The fabrication of certain components of the apparatus, such as the piezoelectric element, the electrodes associated therewith, the signal processor, the signal generator, should be well known to the skilled man. Further, whilst the above simulations of the apparatus have been concerned with a signal with a 40 MHz centre frequency, various other operational frequencies are contemplated for data communications, such as including those in the range of 1 MHz to 100 MHz. However, for sonar type applications, frequencies lower than 1 MHz are contemplated.

As discussed above, the intermediate layer (or carrier plate) of the apparatus may be a metal plate; however the intermediate layer may alternatively be formed from the material of the active piezoelectric element, which layer is provided with a protrusion array but is passive insofar as it is not activated by an electrical signal. Where the intermediate layer is formed from the same material as the piezoelectric element (e.g. PZT) a good acoustic match between the element and the intermediate layer is ensured but provisions should be taken to also ensure that the electrodes on the adjacent active piezoelectric element do not drive the piezoelectric intermediate layer.

The embodiments described above contain features or components which may be transferred to other embodiments without exercising inventive effort. To maintain a clear and concise description, not every single possible combination has been explicitly described. However it is submitted that all combinations of components are fully disclosed as these combinations would be apparent to the skilled man from the description provided above.

The invention claimed is:

1. A transducer apparatus for acoustic communications through a substrate at a predetermined centre frequency, the apparatus comprising:
    a piezoelectric element for generating an acoustic signal;
    a carrier plate, having a first surface for accommodating the piezoelectric element, and having a first array of protrusions on a second surface opposite the first surface; and
    a second array of protrusions at a surface of the substrate,
    wherein the piezoelectric element is mounted onto the carrier plate, and the carrier plate is secured in position relative to the substrate such that the first array of protrusions opposes and is separated from the second array of protrusions by an inter-arrays medium that is different than the substrate such that the acoustic signal may propagate from the piezoelectric element, through the carrier plate, through the first array of protrusions, through the inter-arrays medium, and through the second array of protrusions.

2. A transducer apparatus according to claim 1 wherein the first array of protrusions are dimensioned and arranged such that the distance between the median point on a first first-array protrusion and the median point on an adjacent first-array protrusion is less than the wavelength of an acoustic wave in the carrier plate the predetermined frequency; and/or the second array of protrusions are dimensioned and arranged such that the distance between the median point on a first second-array protrusion and the median point on an adjacent second-array protrusion is less than the wavelength of an acoustic wave in the substrate at the predetermined frequency.

3. A transducer apparatus according to claim 1 wherein at least one of the first array of protrusions and the second array of protrusions comprises binary protrusions, each binary protrusion extending generally perpendicularly from at least one of the surface of the substrate and the second surface of the carrier plate, each binary protrusion having a generally constantly-shaped cross section along the axis of the extension.

4. A transducer apparatus according to claim 3 wherein the constantly-shaped cross section is a rectangular cross section.

5. A transducer apparatus according to claim 1 wherein at least one of the first array of protrusions and the second array of protrusions comprises multi-step protrusions each multi-step protrusion having a first step extending generally perpendicularly from at least one of the surface of the substrate and the second surface of the carrier plate, the first step having a first shaped cross section, the first shaped cross section being generally constantly-shaped along the axis of the extension and having a second step extending from the first step, the second step having a second shaped cross section, the second shaped cross section being generally constantly-shaped along the axis of the extension, the second step having a smaller cross sectional area than the first.

6. A transducer apparatus according to claim 1 wherein at least one of the first array of protrusions and the second array of protrusions comprises tapered protrusions, each tapered protrusion extending from at least one of the surface of the substrate and the second surface of the carrier plate, each tapered protrusion having a base with a first cross section shape, and extending along the axis of the extension from the base to a second cross-section shape, and continuously tapering between the base and the second section shape.

7. A transducer apparatus according to claim 6 wherein the bases of the tapered protrusions are substantially adjacent and are arranged to tessellate.

8. A transducer apparatus according to claim 6 wherein the second cross-section shape is a point such that the protrusion has the form of a pyramid.

9. A transducer apparatus according to claim 1 wherein the predetermined centre frequency is within the range 1 MHz to 100 MHz.

10. A transducer apparatus according to claim 1 wherein a layer of adhesive is provided between the carrier plate and the substrate, and the adhesive has a thickness equal to at least a third of the wavelength of the signal predetermined centre frequency in the adhesive.

11. A method of arranging a transducer unit at a substrate, for acoustic communications through the substrate, comprising:
    forming a first array of protrusions at a surface of the substrate;
    providing a transducer unit for generating or receiving an acoustic signal at a predetermined centre frequency;
    providing a carrier plate, having a first surface for accommodating the transducer unit;
    forming a second array of protrusions upon a second surface of the carrier plate opposite the first surface; and
    fixing the transducer unit onto the first surface of the carrier plate, the carrier plate being secured in position relative to the substrate such that the first array of protrusions opposes and is separated from the second array of protrusions by an inter-arrays medium that is different than the substrate such that the transducer unit is arranged to receive/transmit acoustic signals via the carrier plate, the second array of protrusions, the inter-arrays medium, and the first array of protrusions.

12. A method according to claim 11 wherein the transducer unit comprises an active piezoelectric element.

13. A method according to claim 11 wherein forming at least one of the first array of protrusions and the second array of protrusions is by embossing the respective surface of the transducer unit and substrate.

14. A method according to any of claims 11 wherein forming at least one of the first array of protrusions and the second array of protrusions comprises:
attaching a covering at the surface of the substrate or the carrier plate;
forming the protrusions at the covering.

15. A method according to claim 14 wherein the substrate is steel and the covering is formed from copper.

16. A carrier plate for attachment to an active piezoelectric element, the carrier plate comprising:
an array of reflection-loss mitigating protrusions for mitigating acoustic impedance loss in a transducer apparatus operating at a predetermined centre-frequency, and in an environment comprising a predetermined medium,
wherein the array of reflection-loss mitigating protrusions are dimensioned and arranged such that the distance between the median point on a first protrusion and the median point on an adjacent protrusion is less than the wavelength of an acoustic wave in the plate at the predetermined centre-frequency, and is less than the wavelength of an acoustic wave in the predetermined medium at the predetermined centre-frequency,
wherein the protrusions are pyramid-shaped and arranged to tessellate at their bases, and
wherein each pyramid has a height equal to or greater than 0.8 times the wavelength of the acoustic wave in the predetermined medium at the predetermined centre-frequency.

17. The plate according to claim 16 wherein the predetermined medium is fluid, and the plate is part of a sonar system.

18. The plate according to claim 16 wherein each pyramid has a height equal to or greater than 1.5 times the wavelength of the acoustic wave in the predetermined medium at the predetermined centre-frequency.

* * * * *